United States Patent
Johansson et al.

(10) Patent No.: US 6,734,478 B2
(45) Date of Patent: May 11, 2004

(54) FERROELECTRIC MEMORY CIRCUIT AND METHOD FOR ITS FABRICATION

(75) Inventors: Nicklas Johansson, Rimforsa (SE); Lichun Chen, Linköping (SE)

(73) Assignee: Thin Film Electronics ASA, Oslo (NO)

( * ) Notice: Subject to any disclaimer, the term of this patent is extended or adjusted under 35 U.S.C. 154(b) by 0 days.

(21) Appl. No.: 10/169,064

(22) PCT Filed: Nov. 27, 2001

(86) PCT No.: PCT/NO01/00473
§ 371 (c)(1),
(2), (4) Date: Oct. 23, 2002

(87) PCT Pub. No.: WO02/43071
PCT Pub. Date: May 30, 2002

(65) Prior Publication Data
US 2003/0056078 A1 Mar. 20, 2003

(30) Foreign Application Priority Data
Nov. 27, 2000 (NO) ............................................ 20005980

(51) Int. Cl.[7] ............................................. H01L 31/119
(52) U.S. Cl. ......................... 257/295; 257/295; 257/40; 257/642
(58) Field of Search ................................. 257/295, 249, 257/737; 156/224, 229; 313/503; 365/163; 307/201

(56) References Cited

U.S. PATENT DOCUMENTS

| | | | |
|---|---|---|---|
| 5,118,538 A | | 6/1992 | Escher et al. |
| 5,356,500 A | * | 10/1994 | Scheinbeim et al. ........ 156/229 |
| 5,436,742 A | | 7/1995 | Tanaka et al. |
| 5,705,888 A | * | 1/1998 | Staring et al. .............. 313/503 |
| 6,072,716 A | * | 6/2000 | Jacobson et al. ........... 365/163 |
| 6,545,384 B1 | * | 4/2003 | Pelrine et al. .............. 310/309 |

FOREIGN PATENT DOCUMENTS

| WO | WO 98/14989 | 4/1998 |
|---|---|---|
| WO | WO 98/58383 | 12/1998 |

* cited by examiner

Primary Examiner—David Nelms
Assistant Examiner—Thinh T Nguyen
(74) Attorney, Agent, or Firm—Jacobson Holman PLLC

(57) ABSTRACT

A ferroelectric memory circuit includes a ferroelectric memory cell in the form of a ferroelectric polymer thin film and first and second electrodes respectively, contacting the ferroelectric memory cell at opposite surfaces thereof, whereby a polarization state of the cell can be set, switched or detected by applying appropriate voltages to the electrodes. At least one of the electrodes includes at least one contact layer. The at least one contact layer including a conducting polymer contacting the memory cell, and optionally a second layer of a metal film contacting the conducting polymer, whereby the at least one of the electrodes either includes a conducting polymer contact layer only, or a combination of a conducting polymer contact layer and a metal film layer. A method in the fabrication of a ferroelectric memory circuit of this kind includes steps for depositing a first contact layer of conducting polymer thin film on the substrate, depositing subsequently a ferroelectric polymer thin film on the first contact layer, and then depositing a second contact layer on the top of the ferroelectric polymer thin film.

17 Claims, 4 Drawing Sheets

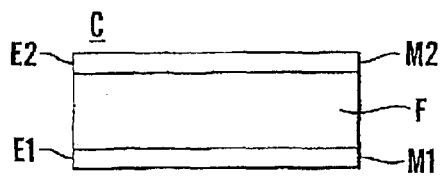
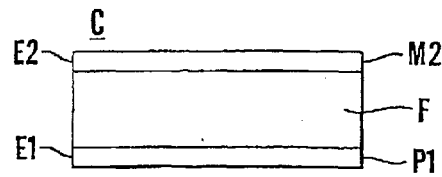
Fig. 1 (Prior Art)　　　　　Fig. 2a
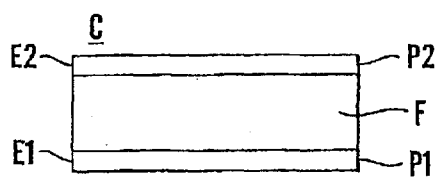
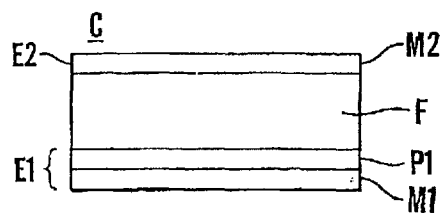
Fig. 2b　　　　　Fig. 2c
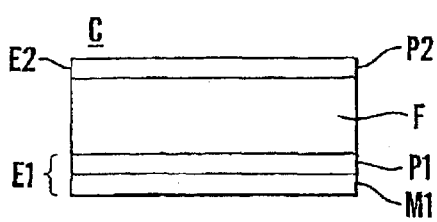
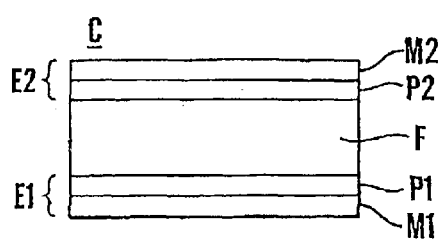
Fig. 2d　　　　　Fig. 2e

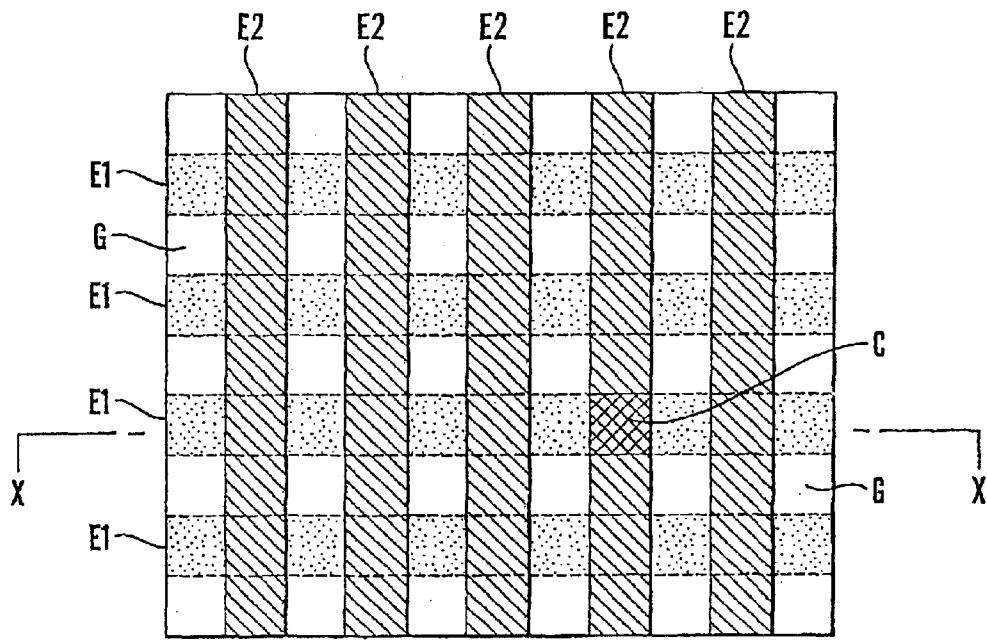
Fig.3
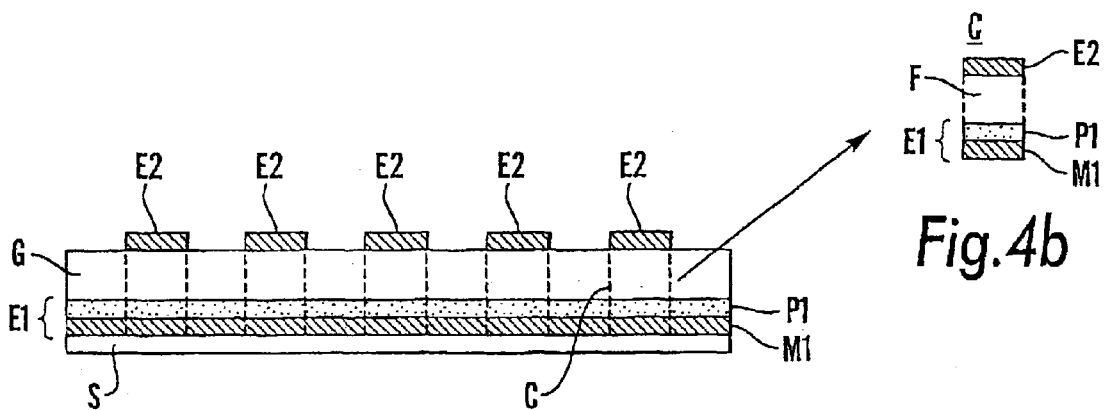
Fig.4b
Fig.4a

FERROELECTRIC MEMORY CIRCUIT AND METHOD FOR ITS FABRICATION

This is a nationalization of PCT/NO01/00473 filed Nov. 27, 2001 and published in English.

FIELD OF THE INVENTION

The present invention concerns a ferroelectric memory circuit comprising a ferroelectric memory cell in the form of a ferroelectric polymer thin film and first and second electrodes respectively contacting the ferroelectric the memory cell at opposite surfaces thereof, whereby a polarization state of the cell can be set, switched and detected by applying appropriate voltages to the electrodes. The invention also concerns a method in the fabrication of a ferroelectric memory circuit of this kind, wherein the memory circuit is provided on an insulating substrate.

The present invention deals with the polarization and switching process in a ferroelectric polymer thin film in memory circuits. Such circuits are used to realize bistable ferroelectric memory devices.

In particular the present invention concerns how to improve the performance of ferroelectric poly(vinylidene fluoride-trifluoroethylene) polymer thin and ultrathin films in a circuit of this kind, where memory cells in the thin film are switched between two polarization states by means of an electric field.

BACKGROUND OF THE INVENTION

Ferroelectric thin (0.1 $\mu$m to 1 $\mu$m) and ultrathin (below 0.1 $\mu$m) films can be used as bistable memory devices are well-known in the prior art. The use of ferroelectric polymer in thin film form can realize fully integrated devices in which polarization switching can occur at low voltages. However, the investigation of the thickness dependence of polarization behaviour of the most widely used ferroelectric polymer according to prior art, i.e. polyvinylidene fluoride-trifluoroethylene (PVDF-TFE), shows that the polarization level decreases and the switching field increases as the thickness is reduced, and further that a large drop in the polarization level is observed as the thickness is reduced to below 100 nm. In PVDF-TFE polymer films, the polarization behaviour is directly related to the crystallinity and crystallite size in the film. It is believed that in thin films, a stiff metal substrate on which the film is normally deposited by spin-coating, may inhibit the crystallization process due to the heterogeneous nucleation process which determines the crystallite orientation being influenced by the substrate. As a result, neighbouring crystallites may have large orientation mismatches which cause a high elastic energy in the film and prevent the further growth of crystallites, thus creating an interface region between the metal substrate and the thin film. On the other hand, recent experimental results seem to indicate that a high crystallinity may be obtained even with a metal substrate, so that the actual mechanism at present remains somewhat unclear. The interface has a thickness which is a considerable fraction of the thin-film thickness, causing a lower polarization level and a higher coercive field. Due to said interface, thin films in contact with a metal layer exhibit a lower polarization level and high switching field.

SUMMARY OF THE INVENTION

Hence, a major object of the present invention is to obviate the above-mentioned disadvantages of the prior art technology for ferroelectric memory circuits. Particularly it is also an object of the present invention to improve the polarization and switching behaviour in ferroelectric memory circuits with ferroelectric polymer thin films as the memory material.

The above objects as well as further features and advantages are realized with a ferroelectric memory circuit according to the invention which is characterized in that at least one of the electrodes comprises at least one contact layer, said at least one contact layer comprising a conductive polymer contacting the memory cell, and optionally a second layer of a metal film contacting the conducting polymer, whereby said at least one of the electrodes either comprises a conducting polymer contact layer only, or a combination of a conducting polymer contact layer and a metal film layer.

In an advantages embodiment of the ferroelectric memory circuit of the invention, wherein only one of the electrodes comprises the conducting polymer contact layer, the other electrode comprises a single metal film layer.

Preferably the ferroelectric polymer thin film has a thickness of 1 $\mu$m or less and preferably the conducting polymer has a thickness between 20 nm and 100 nm.

Preferably the ferroelectric memory cell comprises at least one polymer selected among one of the following, viz. polyvinylidene fluoride (PVDF), polyvinylidene with any of its copolymers, ter-polymers based on either copolymers or PVDF-trifluoroethylene (PVDF-TFE), odd-numbered nylons, odd-numbered nylons with any of their copolymers, cyanopolymers, and cyanopolymers with any of their copolymers. In that connection it is preferred the conducting polymer of the contact layer is selected among one of the following, viz. doped polypyrrole (PPy), doped derivatives of polypyrrole (PPy), doped polyaniline, doped derivatives of polyaniline, doped polythiophenes, and doped derivatives of polythiophenes.

Generally it is preferred that the conducting polymer of the contact layer is selected among one of the following polymers, viz., doped polypyrrole (PPy), doped derivatives of polypyrrole (PPY), doped polyaniline, doped derivatives of polyaniline, doped polythiophenes, and doped derivatives of polythiophenes.

It is also preferable that metal of the metal film layer is selected among one of the following, viz. aluminium, platinum, titanium and copper.

Advantageously the ferroelectric memory circuit according to the invention forms a memory circuit in a matrix-addressable array of similar circuits, that memory cell of a memory circuit forms a portion in a global layer of ferroelectric polymer thin film, and the first and second electrodes form portions of a first and second electrode means respectively, each electrode means comprising a plurality of parallel strip-like electrodes with the electrodes of the second electrode means being oriented at an angle, preferably orthogonally, to the electrodes of the first electrode means with the ferroelectric polymer thin film global layer in sandwich therebetween, such that the ferroelectric memory cell is defined in the ferroelectric polymer thin film at the crossings of respectively the electrodes of the first electrode means and the electrodes of the second electrode means, whereby the array formed by the electrode means and the ferroelectric polymer thin film with the memory cells forms an integrated passive matrix-addressable ferroelectric memory device wherein the addressing of respective memory cells for write and read operations take place via the electrodes of the electrodes means in a suitable connection with external circuitry for driving, control and detection.

The above-mentioned objects as well as further features and advantages are also realized with a method in the fabrication of ferroelectric memory circuit according to the invention, the method being characterized by depositing a contact layer of conducting polymer on the substrate, depositing subsequently a ferroelectric polymer thin film on the contact layer, and then depositing a second contact layer on the top of the ferroelectric polymer thin film.

In the method according to the invention it is considered advantageous depositing a metal film layer on the substrate before the first contact layer is deposited and depositing the latter subsequently.

In the method according to the invention it is preferable depositing the conducting polymer thin film by means of spin coating, and similarly depositing the ferroelectric polymer thin film on the first contact layer by means of spin coating.

In a preferred embodiment of the method according to the invention the first contact layer and/or the ferroelectric polymer thin film are annealed at a temperature of about 140° C. after the respective deposition steps.

In another preferred embodiment of the method according to the invention a second contact layer of a conducting polymer thin film is deposited on the top of the ferroelectric polymer thin film. In that connection it is preferred to anneal the second contact layer at a temperature of about 140° C. without annealing the ferroelectric polymer thin film before depositing the second contact layer, and preferably a metal film layer can be deposited on the top of the second contact layer.

BRIEF DESCRIPTION OF THE DRAWINGS

The invention shall be explained in more detail in the following in connection with discussions of exemplary embodiments and examples, with reference to the appended drawing figures in which FIG. 1 shows a ferroelectric memory cell according to prior art, FIG. 2a a first embodiment of a ferroelectric memory cell according to the present invention, FIG. 2b second embodiment of a ferroelectric memory cell according to the present invention, FIG. 2c a third embodiment of a ferroelectric memory cell according to the present invention, FIG. 2d a fourth embodiment of a ferroelectric memory cell according to the present invention, FIG. 2e a fifth embodiment of a ferroelectric memory cell according to the present invention, FIG. 3 schematically a plan view of a ferroelectric memory device as known in the prior art, but with memory circuits according to the present invention.

FIG. 4a a section taken along the line X—X in FIG. 3,

FIG. 4b a detail of a memory circuit according to the present invention and as used in the memory device in FIG. 3, FIG. 5 a comparison of the hysteresis loop obtained respectively with the memory circuit according to the present invention and a prior art memory circuit, and FIG. 6 the fatigue behaviour of memory circuit according to the present invention compared with that of a prior art memory circuit.

DETAILED DESCRIPTION OF THE PREFERRED EMBODIMENTS

Figure 5:
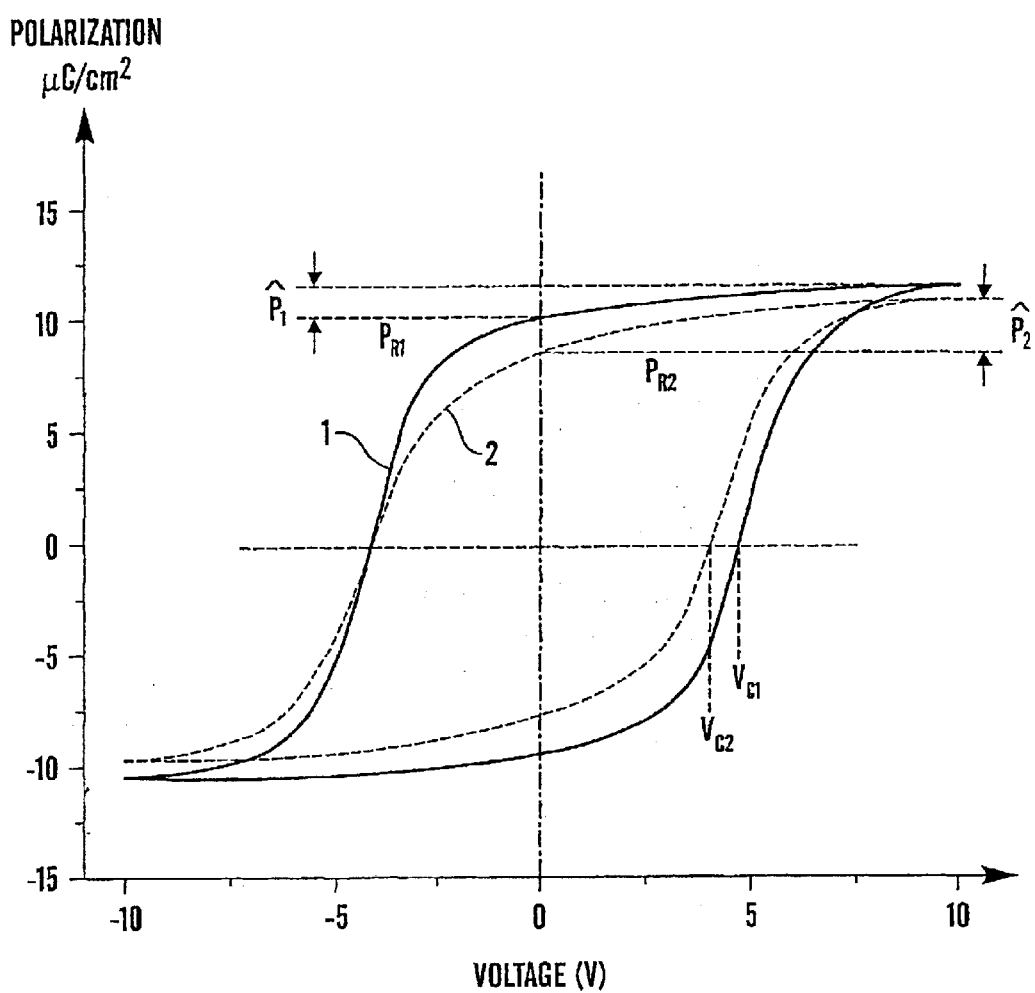

Now various embodiments of the memory circuit according to the present invention shall be discussed, taking a prior art memory circuit as shown in FIG. 1 as the point of departure. In FIG. 1 which shows on section through a prior art memory circuit, a layer F of a ferroelectric thin film polymer is sandwiched between first and second electrodes $E_1;E_2$ respectively. The electrodes are provided as metal films $M_1;M_2$ and it is to be understood that the metal of the electrodes may be the same, but not necessarily so.

A first embodiment of a memory circuit C according to the invention as shown in FIG. 2a which is similar to the prior art memory circuit in FIG. 1, but in the bottom electrode $E_1$ the metal film $M_1$ has now been replaced by a thin film $P_1$ of conducting polymer, while the top electrode $E_2$ is retained as a metal film electrode.

A second embodiment of the memory circuit C according to the invention shown in FIG. 2b and herein both electrodes $E_1; E_2$ are realized as thin films $P_1;P_2$ of conducting polymer which in either case can be the same or different conducting polymers.

FIG. 2c shows a third embodiment of the memory circuit C according to the invention and here the first electrode $E_1$ comprises a conducting polymer thin film $P_1$ as a contact layer interfacing the ferroelectric polymer F. On the conducting polymer thin film $P_1$ there is provided a metal film $M_1$ such that the first electrode $E_1$ in this case is a composite formed by two layers $M_1$, $P_1$. The second electrode $E_2$ is similar to that of the first embodiment, comprising a metal film $M_2$ interfacing the ferroelectric thin film polymer F which constitutes the memory material, in other word the memory cell proper.

A fourth embodiment of the memory circuit C according to the invention is shown in FIG. 2d and it differs from the embodiment in FIG. 2c in that the second electrode $E_2$ now comprises a contact layer of conducting polyiTler thin film $P_2$ only.

Finally a fifth embodiment of the memory circuit C according to the invention is shown in FIG. 2e, and here both electrodes $E_1; E_2$ are now composite, formed of respectively metal film $M_1; M_2$ and thin film conductor polymer $P_1; P_2$ provided as a contact layer between the metal film $M_1; M_2$ and interfacing the ferroelectric thin film polymer F of the memory cell proper.

Conventionally, as known to persons skilled in the art, the prior art memory cell can be applied as a memory cell in a passive matrix-addressable ferroelectric memory device of the kind shown in FIG. 3, wherein the memory material, i.e. the ferroelectric thin film, is provided as a global layer G. However, a passive matrix ferroelectric memory device with a similar layer G can also incorporate any of the memory circuit embodiments in FIGS. 2a–2e. A memory device then comprises the ferroelectric thin film polymer provided in a global layer G and used as a memory material in a memory circuit C. Further the memory device comprises first electrode means in the form of strip-like parallel bottom electrodes $E_1$ interfacing the global layer G of ferroelectric thin film polymer. A second electrode means of similar electrodes $E_2$ is now provided on the top of the ferroelectric thin film polymer, but with the strip-like parallel electrodes $E_2$ oriented at an angle, preferably perpendicularly to the electrodes $E_1$ of the first electrode means. FIG. 4a shows a cross section of the passive matrix-addressable memory device in FIG. 3 taken along the line X—X thereof. As rendered the ferroelectric memory device is now provided with a memory circuit C corresponding to the embodiment shown in FIG. 2c or FIG. 2d, that is with a composite bottom electrode $E_1$ of a metal film $M_1$ and a contact layer of conducting polymer $P_1$ interfacing a portion F the global layer G of ferroelectric polymer thin film used as the memory material in the memory cell.

In the memory device shown in FIG. 3 and FIG. 4a the overlapping crossing of an electrode $E_2$ of the second electrode means with an electrode $E_1$ of the first electrode means defines a memory cell F in the volume of the ferroelectric polymer thin film therebetween as indicated in respectively FIGS. 3 and 4a. Hence the memory circuit C according to the invention forms a portion of the complete memory array with the ferroelectric memory material F and the electrodes $E_1$; $E_2$ as depicted in FIGS. 3, 4a, although now the electrodes $E_1$;$E_2$ of the memory circuit as well as the memory material F thereof, all form respective definable portions of the electrodes $E_1$; $E_2$ and the memory material F as applied globally in the ferroelectric memory device of FIG. 3.

FIG. 4b details a memory circuit C as used in a passive matrix-addressable ferroelectric memory device, as emphasized in either FIG. 3 or FIG. 4a. It will be seen that the memory circuit C in this case corresponds to either the embodiment in FIG. 2c or the embodiment in FIG. 2d. In other words, while the bottom electrodes $E_1$ comprises a metal film $M_1$ and a contact layer of a conductive polymer $P_1$. The top electrode $E_2$ May now either be a metal film $M_2$ or a conductive polymer $P_2$. There is of course, nothing to preclude the use of any of the embodiments depicted in FIGS. 2a–2e in the matrix-addressable memory device shown in either FIG. 3 and FIG. 4a.

Now the present invention shall be discussed in general terms. A memory circuit C according to the invention comprises a ferroelectric polymer thin film on a substrates that is covered with a conductive polymer. According to an aspect of the invention, a soft conducting polymer, such a conducting polythiophene, is deposited onto a metallized substrate, for instance a silicon wafer covered with platinum or aluminum. A ferroelectric thin polymer film, the thickness of which may be 20 nm to 1 µm, for instance of polyvinylidene fluoride-trifluoroethylene copolymer (PVDF-TFE) is then deposited on the substrate by e.g. spin-coating. The conducting polymer is used as the bottom electrode, which replaces conventionally used metal electrodes, for instance of metals such as Al, Pt, Au and the like. Provided according to the method of the present invention, the conducting polymer electrodes are thought to increase the crystallinity in the ferroelectric polymer thin film and hence increase the polarization level and reduce the switching field as compared with corresponding thin films on metal electrodes.

The introduction of a conducting polymer as an electrode in the memory cell of the invention serves to reduce the film stiffness, (i.e. increase the film crystallinity) and also to modify the interface electric barrier. Generally, phase separation between polymers reduces a crystal region near their interface. This property is used in the invention by first applying a conducting polymer film on a substrate for forming a bottom electrode. The ferroelectric thin film and the conducting polymer film have a good separation of phase, which will diminish the non-crystallized region of the ferroelectric thin film during a subsequent annealing process. Because of the different charge conduction mechanism in conducting copolymers compared with metal, it is believed that the interface barrier between the electrode and the ferroelectric polymer film is modified in a manner causing both the polarization level and switching speed in the ferroelectric polymer film to increase, while the switching field is reduced, as actually observed in experiments.

In the present invention, the conducting polymers that may be used include, but are not limited to doped polypyrrole (PPy) and their doped derivatives, doped polyaniline and their doped derivatives, and doped polythiophenes and their doped derivatives.

Ferroelectric polymers that may be used in the invention include, but are not limited to, polyvinylidene fluoride (PVDF) and its copolymers with trifluoroethylene (PVRF-TFE), ter-polymers based on either copolymers or PVDF-TFE, other ferroelectric polymers such as odd-numbered nylons or cyanpolymers.

In the present invention, the use of a conducting polymer electrode increases the crystallinity in a PVDF-TFE copolymer thin film are compared with the thin films interfacing electrodes metal, such as Al, Pt, Au and the like. The polarization hysteresis loop show that PVDF-TFE copolymer thin films provided on a conducting polymer electrode have a higher polarization level than those provided with metal electrode, for instance of titanium, under the same applied electric field as shown in FIG. 5 which shall be discussed below. The fabrication of thin and ultrathin ferroelectric polymer films on a planar substrate covered with a conducting polymer shall be described in the following examples.

The disclosed embodiments of the invention are presented for purposes of elucidation and not limitation. The examples are not intended, nor are they to be construed as limiting the scope of the disclosure or the claims.

EXAMPLE 1

In this example a conductive polymer called PEDOT (poly (3,4-ethylene dioxythiophene)) shall be used as one of the electrodes of a ferroelectric polymer in memory circuit with thin film. A PEDOT film can be produced either by chemical polymerization, by electrochemical polymerization or by spin-coating a ready-made solution containing PEDOT-PSS (where PSS is polystyrene sulfonic acid). Here, the chemical method of producing a PEDOT film has been used. The solution for preparing such a film is a mixture between Baytron M (3,4-ethylene dioxythiophene EDOT) and Baytron C (ferric toluene sulphonate solution in n-butanol, 40%), both of them commercially available. The ratio between Baytron C and Baytron M is 6 in the standard mixture solution. Polymerization of EDOT to PEDOT appears around 15 minutes after mixing the two solutions.

The conducting PEDOT polymer is in this example spin-coated on a metallized Si wafer. For polymerization purposes the film is then put on a hot (100° C.) plate for 1 to 2 minutes. A solution washing process follows to remove any non-polymerized EDOT and ferric solution. Isopropanol and deionized water may be alternatively used in this process. On top of the conductive PEDOT film a ferroelectric thin film, in this case 80 nm thick, is deposited by means of spin-coating technique, whereupon an annealing step at 145° C. for 10 minutes follows. A top electrode of titanium is applied to the ferroelectric film by means of evaporation. The ferroelectric film, in this example, is 75/25 copolymer PVDF-TFE.

FIG. 5 shows the hysteresis loop 1 for the ferroelectric polymer thin film processed according to the example 1 disclosed above. The memory circuit C is then provided with a bottom electrode $E_1$ of PEDOT conducting polymer and with titanium as a top electrode $E_2$.

EXAMPLE 2

A conductive polymer, in this case polypyrrole, is deposited on a metallized substrate (such as a silicon wafer covered with Pt or Al) in a known process wherein the substrate is dipped in a solution of the polymer. According to this example, the substrates are dipped into a low concentration polymer solution to reduce the deposition speed.

Generally, the substrates may be immersed in the polymerizing solution for about 3 to about 30 minutes at room temperature. A multi-step dipping process may be used to obtain the desired thickness. In the example, a 30 nm final thickness is used for the polypyrrole layer, although the thickness may be varied in the range of 20 nm to about 100 nm by varying the total dipping time. The described step is then followed by a deposition procedure step, wherein the conducting polymer layer is spin-coated with the ferroelectric polymer thin film layer.

In the present example random PVDF-TrFE copolymers of 75/25 and 68/32 molar content ratio of VDF-TrFE having average molecular weights around 200000 are used for forming the thin film layer. The films are subsequently annealed at 140° C. for 2 hours and cooled slowly down to room temperature.

EXAMPLE 3

A conducting polymer electrode layer is deposited on a metallized substrate (i.e. a silicon wafer covered with platinum, titanium or aluminum films) or on top of a ferroelectric thin film by spin coating from Baytron P solution. The commercial Baytron P is a waterborne solution of PEDOT in presence of polystyrene sulfonic acid (PSS) which serves as a colloid stabilizer. Due to the poor wetting properties of any of the said metal films and a ferroelectric film, a certain amount of surfactant must be added in the Baytron P to allow a uniform and smooth PEDOT-PSS film formation. After spin coating, a heat treatment at 100□C for 2–10 minutes is necessary. This process can increase the conductivity of PEDOT-PSS.

A suitable solvent is used for dissolving the ferroelectric polymer. The only requirement is that this solvent shall not dissolve or swell PEDOT-PSS film at room temperature and prevents a possible diffusion process between the ferroelectric thin film and the PEDOT-PSS film. The concentration of ferroelectric polymer in diethyl carbonate (DEC) is 3%. To obtain a 90 nm thick ferroelectric film a, spin speed of 3800 rpm is used.

A second PEDOT-PSS conducting polymer layer is formed on top of the ferroelectric polymer film. On top of this second conductive layer an electrode layer of titanium is deposited. This is done by evaporating a 150 nm thick titanium film on top of the conducting polymer. The active area is defined by a shadow mask.

FIG. 5 shows the hysteresis loop that can be obtained with a memory circuit according to the present invention. This memory circuit C essentially corresponds to the embodiment of the memory circuit C in FIG. 2a and example 1. For the bottom electrode $E_1$ the conducting polymer $P_1$ is C-PEDOT, that is polythiophene doped with ferric toluene sulphonate. It is supposed to have higher conductivity than PEDOT-PSS. The top electrode $E_2$ is made of a titanium metal film. Loop 1 is the hysteresis loop of the memory circuit C according to the present invention, while loop 2 is the hysteresis loop of a prior art memory circuit C with top and bottom electrodes $E_1;E_2$ both made of titanium. As will be seen, the memory circuit C according to the present invention shows a much higher polarization than the prior art memory circuit, as evident from the compared hysteresis loops. Also the switching polarization $\hat{P}_1$ of the memory circuit C according to the present invention is considerably smaller than the switching polarisation $\hat{P}_2$ of the prior art memory circuit. It should however be noted that the coercive voltage $V_c$ is somewhat higher for the memory circuit of the present invention, probably due to a somewhat larger thickness of the ferroelectric polymer thin film than expected. However, the hysteresis loops compared in FIG. 5 clearly shows that the use of bottom electrodes with a conducting polymer, in this case C-PEDOT, improves the polarization of the ferroelectric thin film polymer used as the memory material appreciably.

Figure 6:
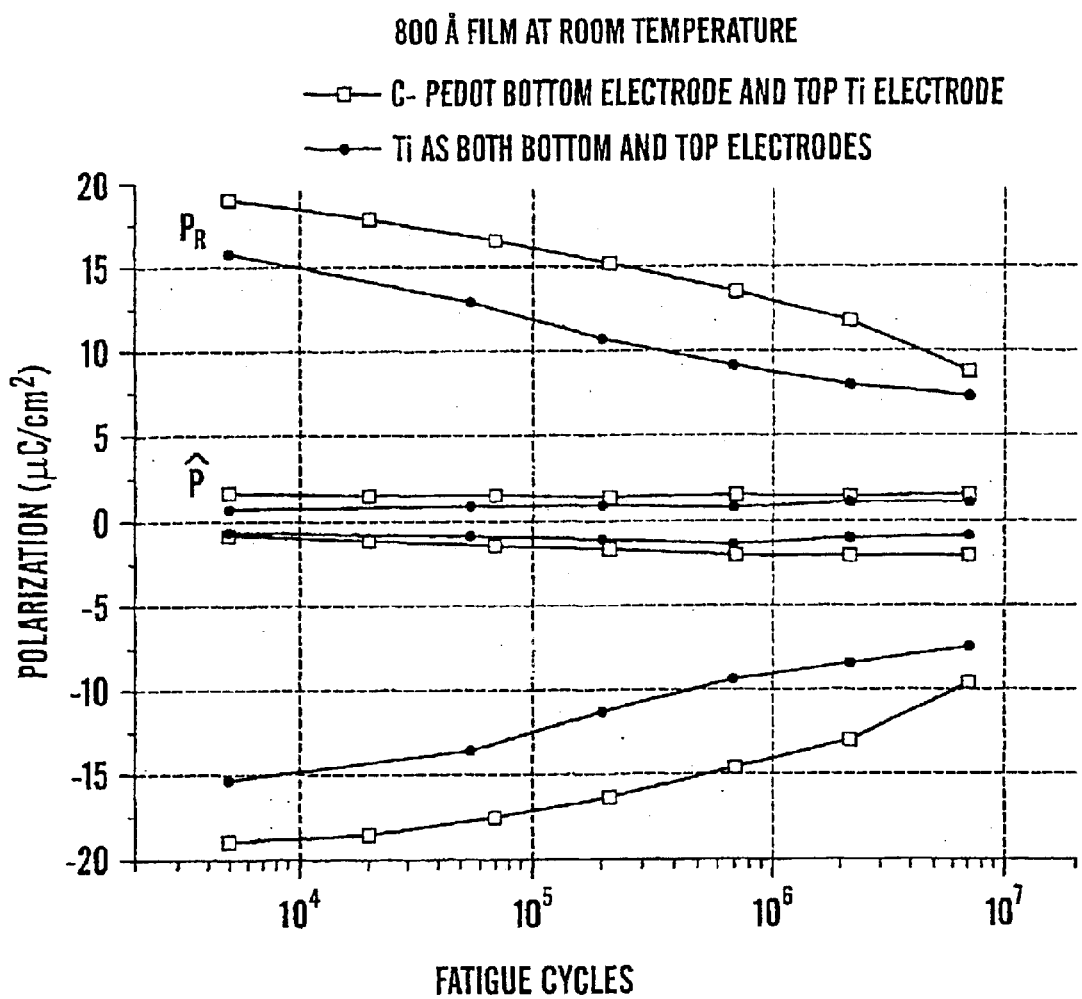

FIG. 6 compares the fatigue of the memory circuit C according to the present invention with the fatigue of a prior art memory circuit at room temperature. It will be seen that the memory circuit according to the invention shows a much-improved polarization as well as fatigue behaviour and the difference between the memory circuit according to the present invention and the prior art memory circuit is appreciable up to more than $10^6$ fatigue cycles.

It is believed that a metal substrate may impose a high elastic energy in ferroelectric thin and ultrathin films due to the orientation mismatch between the neighbouring crystallites which are dictated by using a metal substrate for the ferroelectric polymer thin films. This results in a low crystallinity in ultrathin PVDF-TFE films. As a consequence, ultrathin PVDF-TFE copolymer films of this kind exhibit a lower remanent polarization level and improved switching polarization. In addition, the interface barrier between a metal electrode and ferroelectric polymer film may also increase the switching polarization. In the present invention, the ferroelectric properties of PVDF-TFE films with thickness from 0.05 to 1 µm are characterized. The switching speed under different electric fields has been measured. The experimental results show that, using conducting polymer electrodes, the crystallinity and polarization level are increased due to their match of elastic modulus with that of the ferroelectric polymer films. This is a clear indication that conducting polymer electrodes function properly in ferroelectric thin film devices. Furthermore, it is reasonable to suppose that the modification of the electrode-polymer interface also results in a beneficial modification of the interface barrier causing both the polarization level and switching speed to increase. More important, the polarization level is higher and the coercive field or voltage lower compared with corresponding results for ferroelectric polymer thin films with metal electrodes under the same experimental conditions.

What is claimed is:

1. A ferroelectric memory circuit comprising
a ferroelectric memory cell in the form of a ferroelectric polymer thin film and first and second electrodes respectively, contacting the ferroelectric memory cell at opposite surfaces thereof, whereby a polarization state of the cell is one of set, switched and detected by applying appropriate voltages to the electrodes,
at least one of the electrodes comprises at least one contact layer, said at least one contact layer comprising a conducting polymer contacting the memory cell, whereby said at least one of the electrodes comprises one of a conducting polymer contact layer and a combination of a conducting polymer contact layer and a second layer of a metal film layer.

2. The ferroelectric memory circuit according to claim 1, wherein only one of the electrodes comprises the conducting polymer contact layer and the other electrode comprises a single metal film layer only.

3. The ferroelectric memory circuit according to claim 1, wherein the ferroelectric polymer thin film has a thickness of 1 µm or less.

4. The ferroelectric memory circuit according to claim 1, wherein the conducting polymer has a thickness between 20 nm and 100 nm.

5. The ferroelectric memory circuit according to claim 1, wherein the ferroelectric memory cell comprises at least one polymer selected among one of the following polyvinylidene fluoride (PVDF), polyvinylidene with any of its copolymers, ter-polymers based on either copolymers or PVDF-trifluoroethylene (PVDF-TFE), odd-numbered nylons, odd-numbered nylons with any of their copolymers, cyanopolymers, and cyanopolymers with any of their copolymers.

6. The ferroelectric memory circuit according to claim 5 wherein the conducting polymer of the contact layer is selected among one of the following: doped polypyrrole (PPy), doped derivatives of polyoyrrole (PPy), doped polyaniline, doped derivatives of polyaniline, doped polythiophenes, and doped derivatives of polythiophenes.

7. A The ferroelectric memory circuit according to claim 1, wherein the conducting polymer of the contact layer is selected among one of the following polymers: doped polypyrrole (PPy), doped derivatives of polypyrrole (PPY), doped polyaniline, doped derivatives of polyaniline, doped polythiophenes, and doped derivatives of polythiophenes.

8. The ferroelectric memory circuit according to claim 1 wherein the metal of the metal film layer is selected among one of the following: aluminium, platinum, titanium and copper.

9. A The ferroelectric memory circuit according to claim 1 wherein the ferroelectric memory circuit forms a memory circuit in a matrix-addressable array of similar circuits, the memory cell of a memory circuit forms a portion in a global layer of ferroelectric polymer thin film, and first and second electrodes form portions of a first and second electrode means respectively, each electrode means comprising a plurality of parallel strip-like electrodes with the electrodes of the second electrode means being oriented orthogonally to the electrodes of the first electrode means with the ferroelectric polymer thin film global layer in sandwich therebetween, such that the ferroelectric memory cell is defined in the ferroelectric polymer thin film at the crossings of respectively the electrodes of the first electrode means and the electrodes of the second electrode means, whereby the array formed by the electrode means and the ferroelectric polymer thin film with the memory cells forms an integrated passive matrix-addressable ferroelectric memory device wherein the addressing of respective memory cells for write and read operations take place via the electrodes of the electrodes means in a suitable connection with external circuitry for driving, control and detection.

10. A method in the fabrication of a ferroelectric memory circuit, wherein the memory circuit comprises a ferroelectric memory cell in the form of a ferroelectric polymer thin film and first and second electrodes respectively contacting the ferroelectric memory cell at opposite surfaces thereof, whereby a polarization state of the cell is one of set, switched and detected by applying appropriate voltages to the electrodes and wherein the memory circuit is provided on an insulating substrate, said method comprising the steps of:

depositing a first contact layer of conducting polymer thin film on the substrate, depositing subsequently a ferroelectric polymer thin film on the first contact layer, and then depositing a second contact layer on the top of the ferroelectric polymer thin film.

11. A The method according to claim 10, further comprising depositing a metal film layer on the substrate before the first contact layer is deposited and depositing the latter subsequently.

12. A The method according to claim 10, further comprising depositing the conducting polymer thin film by spin coating.

13. A The method according to claim 10, further comprising depositing the ferroelectric polymer thin film on the first contact layer by spin coating.

14. A The method according to claim 10, further comprising at least one of annealing the first contact layer and the ferroelectric polymer thin film at a temperature of about 140° C. after the respective deposition steps.

15. The method according to claim 10, further comprising depositing a second contact layer of a conducting polymer thin film on the top of the ferroelectric polymer thin film.

16. The method according to claim 15, further comprising annealing the second contact layer at a temperature of about 140° C. without annealing the ferroelectric polymer thin film before depositing the second contact layer.

17. A The method according to claim 15, further comprising depositing a metal film layer on the top of the second contact layer.

* * * * *